United States Patent [19]

Mae et al.

[11] Patent Number: 4,763,811
[45] Date of Patent: Aug. 16, 1988

[54] PARTS FEEDER

[75] Inventors: Takaharu Mae; Hiromi Kinoshita, both of Kofu; Yoshinobu Maeda, Osaka; Koji Fujiwara, Yamatokouriyama; Hiroshi Nakagawa, Kofu, all of Japan

[73] Assignee: Matsushita Electric Industrial Co., Ltd., Osaka, Japan

[21] Appl. No.: 891,028

[22] Filed: Jul. 31, 1986

[30] Foreign Application Priority Data

Jul. 31, 1985 [JP] Japan ............................ 60-169073

[51] Int. Cl.⁴ ............................................ H05K 13/02
[52] U.S. Cl. ....................................... 221/11; 414/403
[58] Field of Search ............... 221/11, 103, 104, 106, 221/242; 29/741, 809; 414/403, 404, 413

[56] References Cited

U.S. PATENT DOCUMENTS

| 4,037,756 | 7/1977 | Jaquish ............................ 221/242 |
| 4,293,998 | 10/1981 | Kawa et al. ...................... 29/741 X |
| 4,401,234 | 8/1983 | Droira et al. ..................... 29/741 X |
| 4,586,251 | 5/1986 | Kinoshita et al. ................. 29/741 |
| 4,599,026 | 7/1986 | Feiber et al. ..................... 221/11 X |

Primary Examiner—F. J. Bartuska
Attorney, Agent, or Firm—Pollock, VandeSande & Priddy

[57] ABSTRACT

A parts feeder includes a stock unit containing a plurality of magazine units arranged side by side and each storing a stack of magazines accommodating an array of parts, and a supply unit for supporting magazines delivered respectively from the magazine units in the stock unit. Parts can be supplied, one at a time, from any of the magazines in the supply unit. The supply unit is movable independently of the stock unit. When any magazine unit runs short of magazines, such a magazine unit can be supplied with new magazines loaded with parts without shutdown of the parts feeder.

18 Claims, 8 Drawing Sheets

PARTS FEEDER

BACKGROUND OF THE INVENTION

The present invention relates to a parts feeder for supplying parts or components stored as arrays in magazines.

Most specially shaped electronic parts or components such as coils, switches, connectors or the like which are available in the market are generally stored as arrays in magazines.

FIG. 12 of the accompanying drawings illustrates one typical parts feeder for supplying such electronic parts stored in magazines to insert them on a printed circuit board. Parts 100 are stored as an array in an elongate magazine 101, and a stack of such magazines 101 is accommodated in a vertically elongate magazine unit 102. Therefore, parts 100 of one type are stored in one magazine unit 102. A plurality of magazine units 102 that are placed side by side is securely mounted on a supply unit 103, which is movable in a horizontal plane for selectively delivering desired parts 100 to an insertion head 105 which inserts the parts 100 into a printed-circuit board 104.

With the above arrangement, however, when the magazines 101 in one magazine unit 102 run short of the stored parts 100, the supply unit 103 must be stopped to supply the empty magazines 101 with new parts 100. Since there are as many types of stored parts as the number of the magazine units 102, the magazine units 102 must be supplied with new parts as many times as the number of the magazine units 102. Furthermore, parts 100 of different types may be of different lengths; parts of one type may be ten times longer than parts of another type. As a consequence, the number of parts that can be stored in one magazine unit 102 may be different from the number of parts that can be stored in another magazine unit 102. In addition, inasmuch as more parts 100 of one type may be inserted into the printed-circuit board 104 than parts 100 of another type, the rates at which parts 100 of different designs are dispensed from different magazine units 102 may vary from each other. For the reasons described above, the magazine units 102 tend to run short of their parts 100 at different times, and hence the supply unit 103 must be stopped at frequent intervals for parts replenishment. This is disadvantageous in that the downtime of the assembling machine associated with the supply unit 103 is increased.

SUMMARY OF THE INVENTION

It is an object of the present invention to provide a parts feeder capable of being replenished with new parts without shutting off an assembling machine associated with the parts feeder.

According to the present invention, a plurality of magazines with parts stored therein are stacked, and such stacks of magazines are arranged side by side in a stock unit. A predetermined number of magazines containing parts are also arranged side by side in a supply unit, and the stored parts are supplied one by one from these magazines. (The supply and stock units are movable independently of each other.) The supply unit may have a movable base, and the stock unit may be fixedly mounted on the movable base.

BRIEF DESCRIPTION OF THE DRAWINGS

The present invention will be described in detail by way of illustrative example with reference to the accompanying drawings, in which.

DETAILED DESCRIPTION

Figure 1:
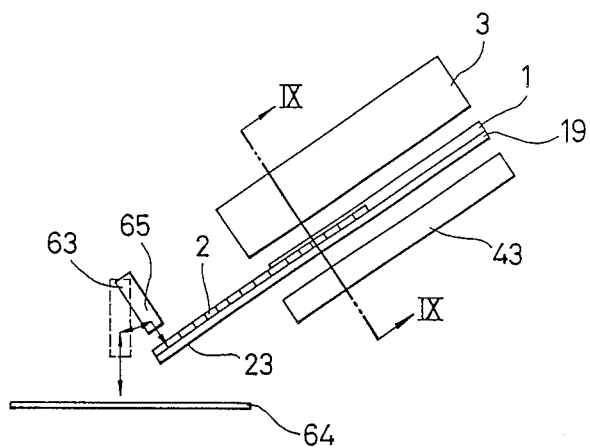
FIG. 1 is a front elevational view of a parts feeder according to the present invention.
Figure 3:
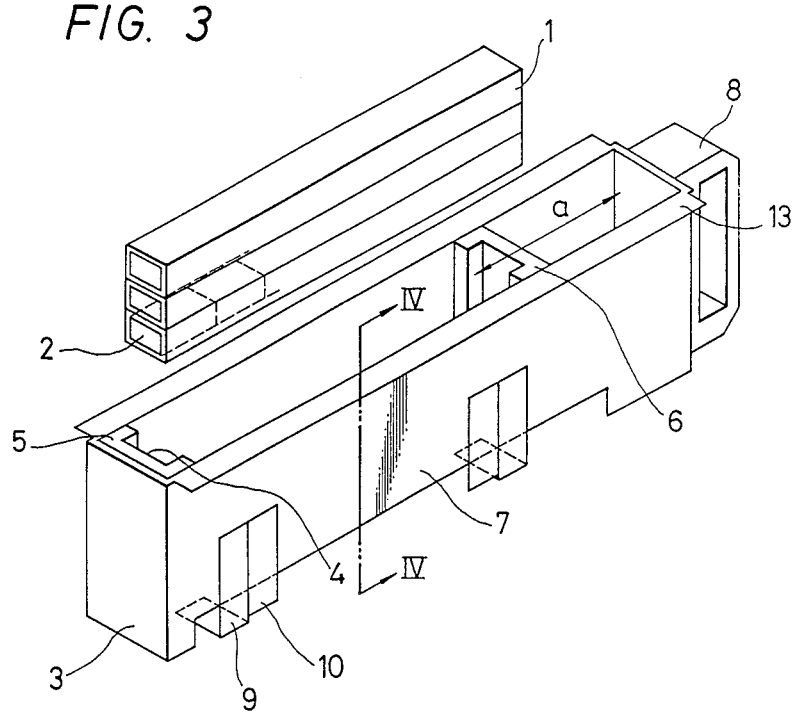
FIG. 3 is a perspective view of a magazine unit.

FIG. 1 schematically illustrates a parts feeder according to the present invention. The parts feeder has a plurality of magazines 1 each made of plastics and in the form of a hollow elongate member having a rectangular cross section. As shown in FIG. 3, each of the magazines 1 is open at opposite ends and can store an array of parts 2 such as IC elements, LSI elements, or the like. A stack of such magazines 1 is disposed in a magazine unit 3. The magazines 1 that can be accommodated in the magazine unit 3 may be of different lengths dependent on the type of parts to be stored therein.

The magazine unit 3 comprises a rectangular hollow elongate unit body 7 which is open at upper and lower ends and a pair of first and second magazine guides 5, 6 disposed in the unit body 7. The first and second magazine guides 5, 6 have respective vertical grooves 4 opening toward each other. The grooves 4 have a width slightly larger than the width of the magazines 1 for receiving the opposite ends of the magazines 1. The second magazine guide 6 is slidably adjustable in position in the direction of the arrow a (FIG. 3). A grip handle 8 is attached to one of opposite longitudinal ends of the unit body 7.

Figure 4:
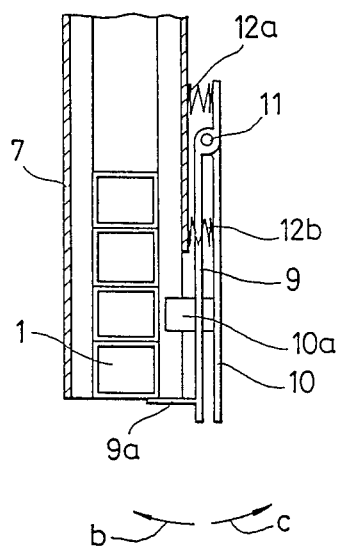
FIG. 4 is a cross-sectional view taken along line IV—IV of FIG. 3.

As shown in FIGS. 3 and 4, two pairs of a receiver lever 9 and a presser lever 10 are swingably mounted by pivot pins 11 on one side wall of the unit body 7, these lever pairs being spaced longitudinally on the unit body 7 at an interval which is slightly smaller than the length of shortest magazines 1 that can be placed in the magazine unit 3. The receiver lever 9 in each pair has a hook 9a on its lower end. The receiver lever 9 in each pair is normally urged by a first spring 12a to turn in the direction of the arrow b for positioning the hook 9a underneath the lower open end of the unit body 7 to engage the lowermost magazine 1 in the magazine unit 3 thereby to prevent the magazine stack from dropping out of the unit body 7. When an external force is applied to the receiver lever 9 in the direction of the arrow c, the receiver lever 9 is turned counterclockwise about the pivot pin 11 until the hook 9a is displaced out of engagement with the lowermost magazine 1 to allow the latter to fall out of the magazine unit 3. The presser lever 10 in each pair has a presser 10a projecting into the unit body 7 for pressing engagement with one, at a time, of the magazines 1. The presser lever 10 is normally urged by a spring 12b to turn about the pivot pin 11 in the direction of the arrow c thereby keeping the presser 10a out of pressing engagement with the magazines 1. At the same time that the receiver lever 9 is turned in the direction of the arrow c, the presser lever 10 is turned by an applied external force in the direction of the arrow b to hold the presser 10a against a side wall of the magazine 1 which is located on the lowermost magazine 1 that has just been released from the hook 9a. As shown in FIG. 3, the unit body 7 has a pair of flanges 13 extending away from each other from the upper ends of the lateral side walls of the unit body 7.

Figure 5:
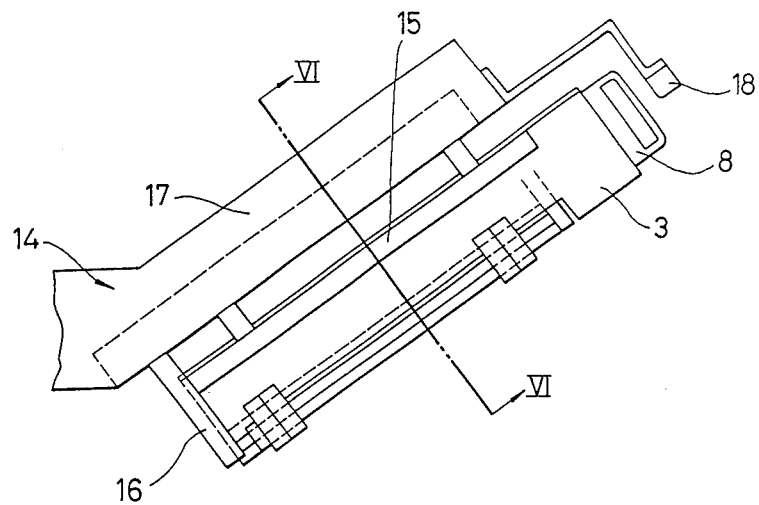
FIG. 5 is a front elevational view of a stock unit.
Figure 6:
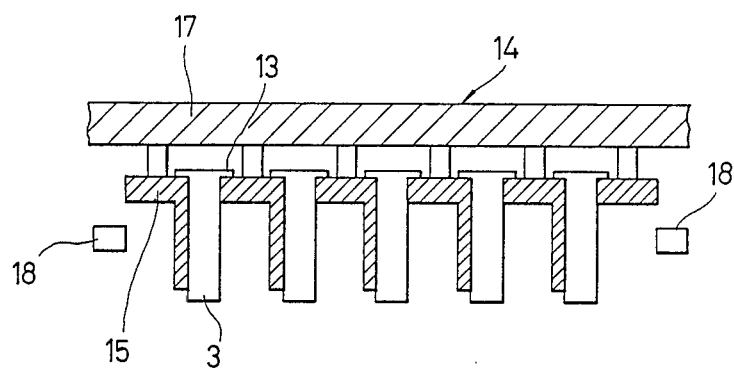
FIG. 6 is a cross-sectional view taken along line VI—VI of FIG. 5.

An array of magazine units 3 arranged side by side is hung on a stock unit 14 (FIG. 5). As shown in FIGS. 5 and 6, the stock unit 14 includes a plurality of unit guides 15 inclined about 35° to the horizontal direction for positioning the magazine units 3 in transversely constant intervals or pitches and supporting, from below, the flanges 13 of the magazine units 3, respectively, suspended in guide grooves defined between the unit guides 15 and a unit stopper 16 disposed at one longitudinal end of the unit guides 15 for positioning the magazine units 3 in their longitudinal direction. The unit guides 15 and the unit stopper 16 are suspended from a base 17. A pair of transmission-type photoelectric switches 18 is fixed to the base 17 in the vicinity of the grip handles 8 of the magazine units 3. The photoelectric switches 18 are spaced from each other by a distance larger than the width of the array of magazine units 3 supported by the stock unit 14.

Figure 2:
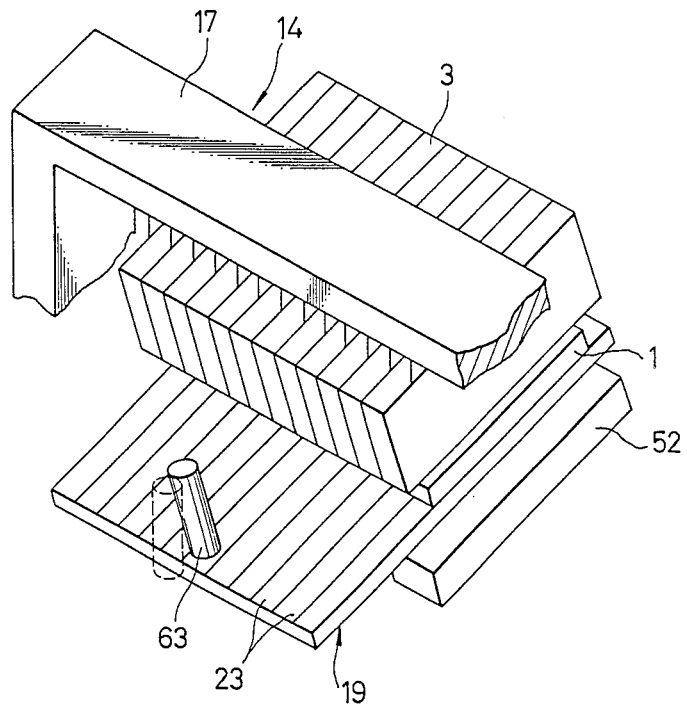
FIG. 2 is a fragmentary perspective view of the parts feeder shown in FIG. 1.
Figure 7:
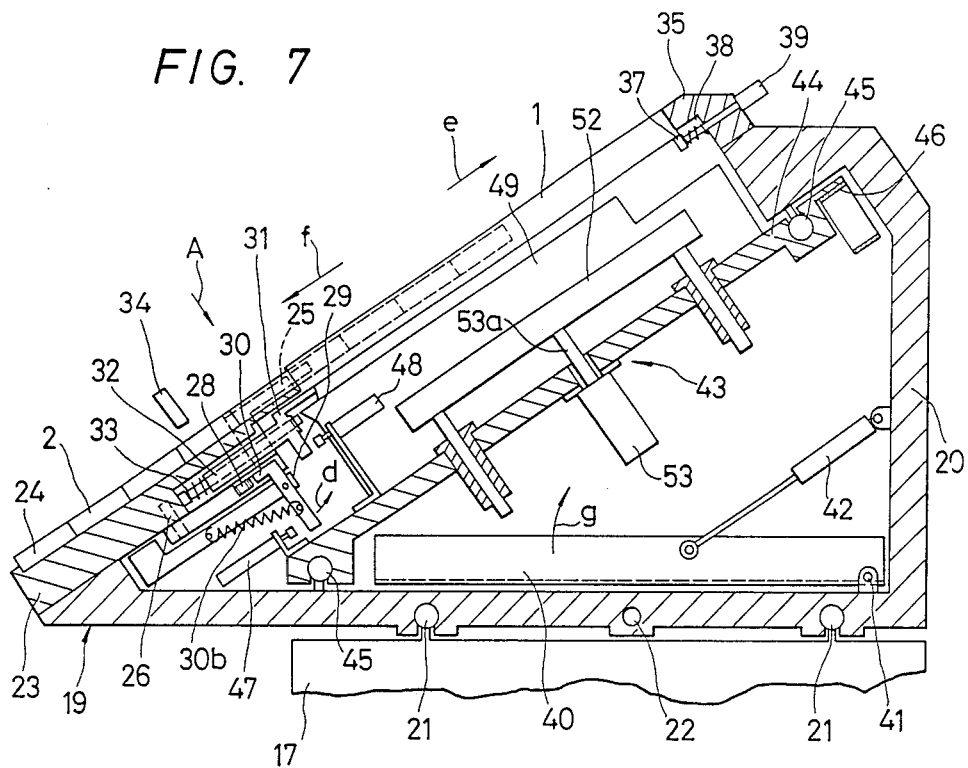
FIG. 7 is a cross-sectional view of a supply unit.

The magazines 1 in the magazine units 3 are transferred to a supply unit 19 (FIGS. 2 and 7). As shown in FIG. 7, the supply unit 19 includes a frame 20 disposed independently below the arrayed magazine units 3 supported by the stock unit 14. The frame 20 is supported on and slidable along a pair of parallel shafts 21 which is fixed to the base 17 perpendicularly to the longitudinal direction of the magazines 1, the frame 20 being movable along the shafts 21 by means of a ball screw 22 extending parallel to and between the shafts 21 and connected to a motor (not shown). The supply unit 19 also includes an array of chutes 23 removably mounted on the frame 20 and inclined at the same angle as the unit guides 15 (FIG. 5). The chutes 23 have respective grooves 24 defined on their upper surfaces for receiving respective arrays of parts 2 discharged from the magazines 1. The chutes 23 are longitudinally aligned with the magazine units 3 supported by the stock unit 14, as shown in FIG. 2.

Figure 8:
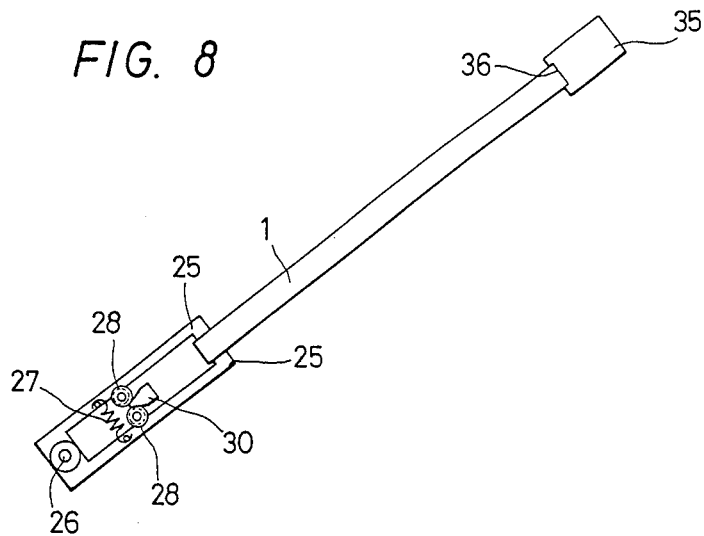
FIG. 8 is a plan view of the supply unit as viewed in the direction of the arrow A in FIG. 7.

As shown in FIG. 8, a pair of gripper jaws 25 is angularly movably mounted by a pivot pin 26 fixed to each of the chutes 23. The gripper jaws 25 are normally urged by a spring 27 toward each other for gripping the front end of one of the magazines 1, the gripper jaws 25 having a pair of respective rollers 28. A cam lever 30 (FIG. 7) is vertically swingably mounted by a pivot pin 29 on each of the chutes 23 and includes a wedge-shaped cam 30a (FIG. 8) which is located near the rollers 28. The cam lever 30 is normally urged by a spring 30b away from the rollers 28. When the cam lever 30 is swung about the pivot pin 29 in the direction of the arrow d (FIG. 7) under an external force applied against the resiliency of the spring 30b, the wedge-shaped cam 30a is forcibly moved between the rollers 28 to space them apart from each other, thus angularly moving the gripper jaws 25 away from each other against the resiliency of the spring 27 to release the front end of the magazine 1.

A holder slider 31 is slidably mounted on a pair of shafts 32 (only one shown in FIG. 7) fixed to each chute 23 and extending parallel thereto. The holder slider 31 is normally urged by a spring 33 to move in the direction of the arrow e for supporting thereon the bottom of the front end of the corresponding magazine 1. When the holder slider 31 is forced to move in the direction of the arrow f against the resiliency of the spring 33, the holder slider 31 is displaced to release the magazine 1. A reflection-type photoelectric sensor 34 is mounted on each chute 23 for detecting whether there is a part 2 discharged from the magazine 1.

An array of guides 35 (FIGS. 7 and 8) is removably mounted on the frame 20 remotely from and in longitudinal alignment with the array of chutes 23, respectively. Each of the guides 35 has a groove 36 (FIG. 8) opening toward the corresponding chute 23 and having a width slightly larger than that of the magazine 1 for receiving the rear end thereof. Holder plates 37 are attached to the guides 35, respectively, and normally urged by springs 38 to hold the bottoms of the rear surfaces of the magazines 1. The holder plates 37 can be retracted out of engagement with the magazines 1 to release them by pulling knobs 39 connected to the holder plates 37, respectively, in the direction of the arrow e. A plurality of swingable buckets 40 is disposed in the frame 20 and angularly movably mounted by respective pivot pins 41 in the frame 20. Each of the swingable buckets 40 can accommodate a plurality of magazines 1 therein and has one longitudinal end open. Each swingable bucket 40 can be turned about the pivot pin 41 by means of a fluid cylinder 42 interconnected between the bucket 40 and the frame 20.

Figure 9:
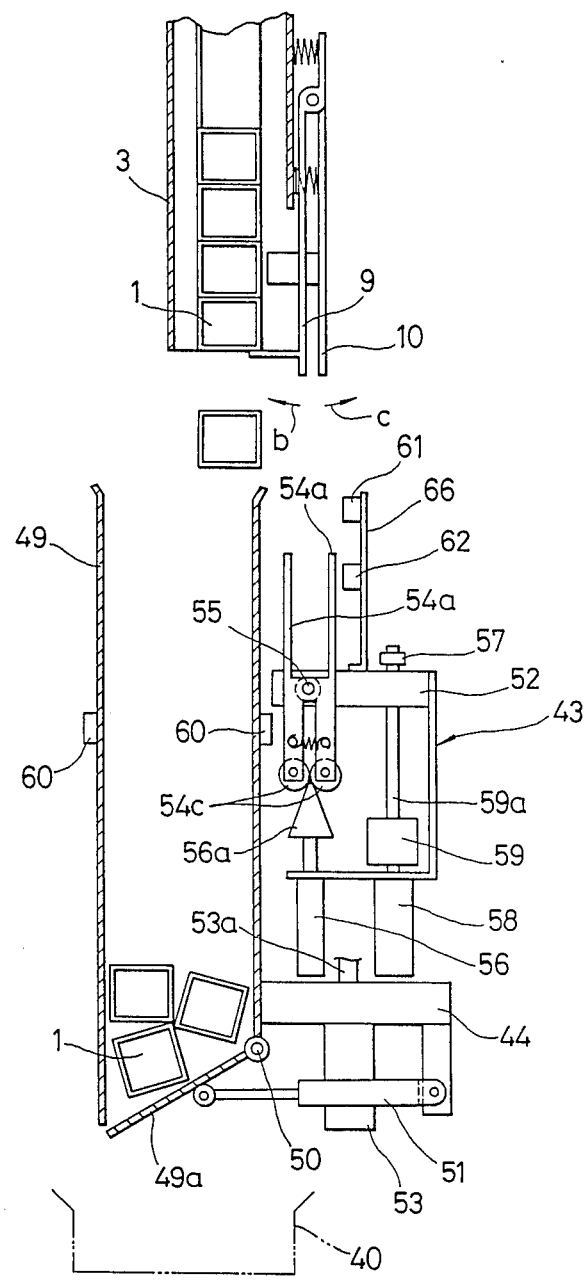
FIG. 9 is a cross-sectional view taken along line IX—IX of FIG. 1.
Figure 10:
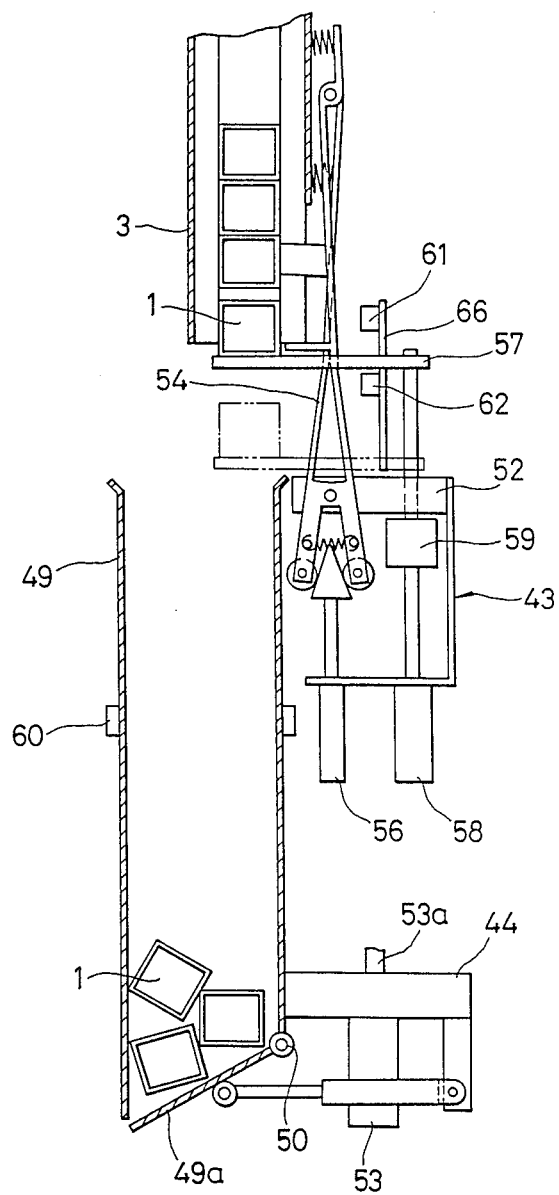
FIG. 10 is a view similar to FIG. 9, showing a magazine that has escaped.
Figure 11:
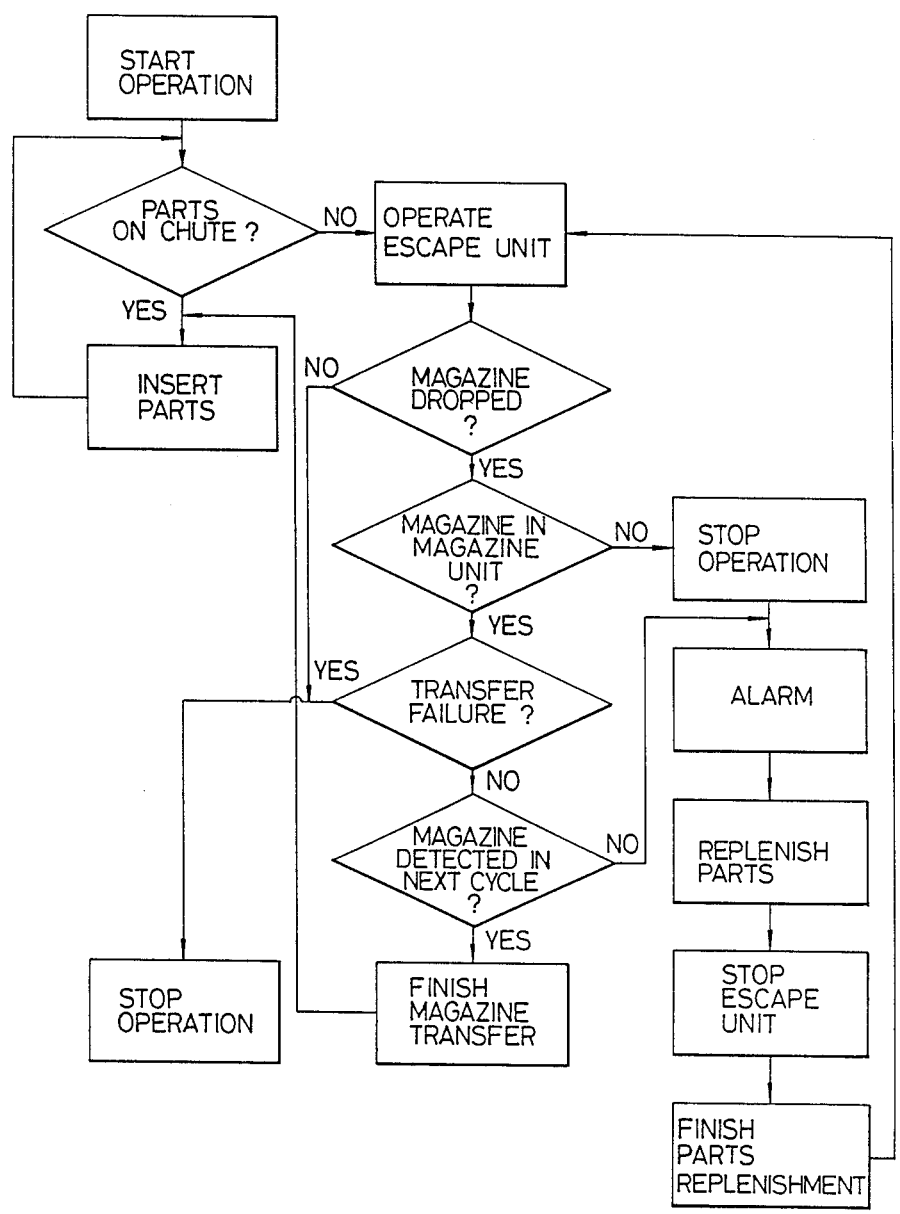
FIG. 11 is a flowchart of an operation sequence of the parts feeder of the invention.
Figure 12:
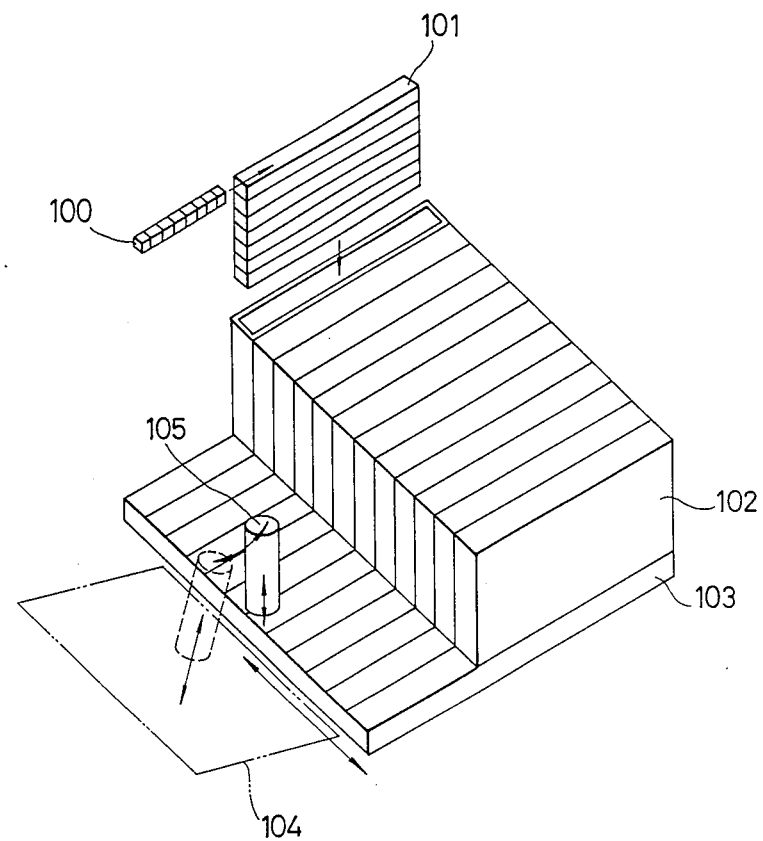
FIG. 12 is a perspective view of a conventional parts feeder.

The magazines 1 can be fed into the supply unit 19 by means of an escape unit 43 (FIGS. 7, 9 and 10). For the sake of brevity, some components of the escape unit 43 are omitted from illustration in FIG. 7. As shown in FIG. 7, the escape unit 43 includes an escape base 44 disposed below the chutes 23 and the guides 35 and slidable along a pair of parallel shafts 45 extending transversely of the magazines 1 and fixed to the frame 20. The escape base 44 can be moved along the parallel shafts 45 on the frame 20 by means of an endless belt 46 attached to the escape base 44 and driven by a motor (not shown). A fluid cylinder 47 is mounted on the escape base 44 for exerting an external force to each cam lever 30 to cause the wedge-shaped cam 30a to open the gripper jaws 25 away from each other. Another fluid cylinder 48 is mounted on the escape for imposing an external force on each of the holder sliders 31 movably mounted on the respective chutes 23.

As shown in FIGS. 9 and 10, an openable bucket 49 is fixedly mounted on the escape base 44 below each magazine unit 3 for receiving magazines 1 which have been released from the gripper jaws 25 and the holder slider 31. The bucket 49 has a bottom 49a swingable about a pivot pin 50 and coupled to a fluid cylinder 51 fixed to the escape base 44. The bottom 49a can therefore be swung open by the fluid cylinder 51 to allow any magazines 1 in the bucket 49 to drop into the swingable bucket 40. A plate 52 is disposed above the escape base 44 and coupled to a piston rod 53a of a fluid cylinder 53 attached to the escape base 44. The plate 52 is movable by the fluid cylinder 53 in a direction transversely of the magazine unit 3 and hence a stack of magazines 1 stored therein. A pair of control levers 54a, 54b is angularly movably mounted on the plate 52 by means of a pivot pin 55. The control levers 54a, 54b have respective rollers 54c mounted on their lower ends and engageable by a wedge-shaped cam 56a connected to a fluid cylinder 56 supported on the plate 52. When the plate 52 is moved to its uppermost position by the fluid cylinder 53, the control levers 54a, 54b are swung toward each other by the wedge-shaped cam 56a driven by the fluid cylinder 56 to engage and move the receiver and presser levers 9, 10 in the directions of the arrows c, b, respectively.

A swing lever 57 is attached to the upper end of a rotatable rod 59a of a rotary fluid cylinder 59 which is vertically movable by a fluid cylinder 58 supported by the plate 52. When the plate 52 is lifted to its uppermost position by the fluid cylinder 53 and the swing lever 57 is raised by the fluid cylinder 58, the swing lever 57 is positioned slightly below the bottom of the lowermost magazine 1 in the magazine unit 3. When the swing lever 57 is lowered by the fluid cylinder 58 while the plate 52 is in the uppermost position, the swing lever 57 is positioned below the holder slider 31 and the holder plate 37. As the swing lever 57 is turned to the position of FIG. 10, it underlies the magazine 1. Upon return of the swing lever 57, it goes out of the position beneath the magazine 1. A pair of transmission-type photoelectric switches 60 is mounted on the bucket 49 and spaced from each other across the downfall passage of magazines 1 in the bucket 49. A reflection-type photoelectric switch 61 is supported on a vertical bar 66 secured to the plate 52. The photoelectric switch 61 serves to detect the lowermost magazine 1 in the magazine unit 3 when the plate 52 is raised to the uppermost position by the fluid cylinder 53. Two reflection-type photoelectric switches 62 (only one shown) are also supported on the vertical bar 66 below the photoelectric switch 61. When the plate 52 reaches the uppermost position, these photoelectric switches 62 have their optical axes positioned slightly below the bottom of the lowermost magazine 1 in the magazine unit 3. The photoelectric switches 62 are spaced from each other by a distance slightly smaller than the length of any shortest magazine which may be stored in the magazine unit 3.

As shown in FIGS. 1 and 2, the parts 2 on any chute 23 are successively inserted by an insertion head 63 into a printed-circuit board 64. The insertion head 63 is movable by a suitable actuator between a first position over the front end of the selected chute 23 and a second position over the printed-circuit board 64. The insertion head 63 has a pair of grip fingers 65 (only one shown) drivable by a suitable actuator for gripping, one at a time, of the parts 2 on the front end of the chute 23. When the insertion head 63 is in the first position, the grip fingers 65 grip one part 2; and when the insertion head 63 is moved to the second position, the part 2 is released from the grip fingers 65 for insertion into the printed-circuit board 64.

Operation of the parts feeder thus constructed will be described below.

The first and second magazine guides 5, 6 in a magazine unit 3 are spaced from each other by a distance slightly larger than the length of the magazines 1 to be placed in the magazine unit 3, and are fixed in place to the magazine unit 3. Then, a stack of magazines 1 is placed in the magazine unit 3 between the first and second magazine guides 5, 6 with the opposite ends of the magazines 1 being received in the grooves 4 of the first and second magazine guides 5, 6, as shown in FIGS. 3 and 4. A plurality of magazine units 3 with stacks of magazines 1 accommodated therein are inserted onto and along the unit guides 15 (FIGS. 5 and 6) of the stock unit 14, and pushed on until they are stopped by the unit stopper 16. Then, the supply unit 19 is moved to a position confronting the magazines 1 of the stock unit 14 in order to transfer the magazines 1 from the stock unit 14 to the chutes 23 and the guides 35 of the supply unit 19, as illustrated in FIG. 2. The escape unit 43 is thereafter operated for successively releasing the lowermost magazines 1 from the magazine units 3 so they will be held by the chutes 23 and the guides 35 of the supply unit 19.

Such transferring operation will hereinafter be described in greater detail. The various fluid cylinders used in the parts feeder will be described as air cylinders, though they may be hydraulic cylinders. When the escape unit 43 has arrived at the desired position confronting the magazine 1 to be transferred, the air cylinder 47 (FIG. 7) on the escape base 44 is actuated to project its piston rod under air pressure supplied thereto for thereby camming the gripper jaws 25 on the chute 23 to be opened and disengages from the front end of the magazine 1. At the same time, the air cylinder 48 on the escape base 44 is also actuated under air pressure to project its piston rod for moving the holder slider 31 in the direction of the arrow f, thus releasing the front end of the magazine 1. The released magazine 1 drops at the front end and then at the rear end, and is stored in the bucket 49 attached to the escape base 44 (FIG. 9). When the rear end of the magazine 1 as it falls blocks a light beam between the transmission-type photoelectric switches 60, the photoelectric switches 60 produce a signal indicating that the magazine 1 has been stored in the bucket 49. Thereafter, the air cylinder 48 is released to move the holder slider 31 in the direction of the arrow e.

Then, the plate 52 is lifted by the air cylinder 53, and the swing lever 57 on the plate 52 is raised to its uppermost position by the air cylinder 58 and turned by the rotary air cylinder 59 until the swing lever 57 is positioned slightly below the bottom of the lowermost magazine 1 in the magazine unit 3 in underlapping relation to the magazine 1. At this time, the reflection-type photoelectric switch 61 on the plate 52 ascertains whether the magazine unit 3 contains a magazine 1 to be transferred. If no magazine 1 is contained, then the photoelectric switch 61 produces an alarm signal. Then, the air cylinder 56 is actuated to move the cam 56a upwardly to turn the control levers 54a, 54b about the pivot pin 55 for engaging and angularly moving the front and rear receiver levers 9 on the magazine unit 3 in the direction of the arrow c (FIG. 9) and also the front and rear presser levers 10 on the magazine unit 3 in the direction of the arrow b. Therefore, the lowermost magzine 1 in the magazine unit 3 is held by the presser 10a (FIG. 4), whereas the lowermost magazine 1 is released from the hook 9a to fall onto the swing lever 57 below the magazine unit 3, as illustrated in FIG. 10.

The swing lever 57 is gradually lowered by the air cylinder 58 to the lowermost position as indicated by the dot-and-dash-line position in FIG. 10. The magazine 1 on the swing lever 57 is now positioned as shown in FIG. 7, whereupon the bottom of the front end of the magazine 1 is supported on the holder slider 31 and the rear end of the magazine 1 is received in and transversely positioned by the groove 36 in the guide 35 (FIG. 8), the bottom of the rear end of the magazine 1 being retained on the holder plate 37. The magazine 1 is now released from the swing lever 57 and vertically spaced therefrom.

The air cylinder 56 is operated again to lower the cam 56a for retracting the control levers 54a, 54b out of engagement with the receiver and presser levers 9, 10. The receiver lever 9 is allowed to turn in the direction of the arrow b (FIG. 9) below the magazine unit 3, and the presser lever 10 is also allowed to turn in the direction of the arrow c out of pressing engagement with the magazine 1, which then drops as the lowermost magazine 1 onto the receiver lever 9. At this time, the lowermost magazine 1 that has fallen onto the receiver lever 9 is detected by the photoelectric switch 61. If no lowermost magazine 1 is detected, the photoelectric switch 61 produces an alarm signal for magazine replenishment. Simultaneously, the front and rear photoelectric switches 62 ascertain whether the magazine 1 to be transferred has dropped completely off the magazine unit 3. If any of the photoelectric switches 62 detects the presence of the magazine 1, it produces a signal indicating a transfer failure to stop the entire operation of the parts feeder.

The swing lever 57 is returned by the rotary air cylinder 59 out of underlapping relation to the lowermost magazine 1. Then, the plate 52 is lowered by the air cylinder 53, and the air cylinder 47 is released to allow the gripper jaws 25 to be closed for forcibly gripping the front end of the magazine 1 transversely. When the magazine 1 is thus transferred to the supply unit 19, the parts 2 are gravity-fed from the magazine 1 into the groove 24 of the chute 23. The above transfer cycle is repeated each time the escape unit 43 is moved along the shafts 45 to a position below one of the successive magazine units 3. Therefore, the successive chutes 23 are filled up with the respective parts 2 supplied from the magazines 1 held in the supply unit 19.

The parts 2 on any of the chutes 23 can successively be applied to the printed-circuit board 64 (FIG. 1) by the insertion head 63 to which the chute 23 has been moved. When the last part 2 on the chute 23 has moved past the sensor 34 (FIG. 7) upon successive consumption of the parts by the insertion head 63, the sensor 34 generates a signal indicating that the magazine 1 has run short of parts. The escape unit 43 then moves to the empty magazine 1, and drops the empty magazine 1 into the bucket 49 and transfers the next magazine 1 full of parts 2 to the supply unit 19 from the magazine unit 3.

To supply any magazine unit 3 with fully loaded magazines 1, the magazine unit 3 is manually pulled out of the stock unit 14 by gripping the grip handle 8 and a new stack of loaded magazines 1 is placed in the magazine unit 3, which is then inserted into the stock unit 14.

When any magazine unit 3 is manually pulled out of the stock unit 14 or pushed into the stock unit 14, the operator's hand reaching the grip handle 8 blocks a beam of light between the photoelectric switches 18, which then produces a signal indicating that the magazine unit 3 is being loaded with new magazines 1. Upon generation of this signal, the entire operation of the escape unit 43 is stopped to prevent it from transferring a magazine from any of the magazine units 3 to the supply unit 19.

The aforesaid process may be repeated to replenish the parts feeder with desired parts without shutdown of the parts feeder.

When parts 2 to be supplied are to be changed, a magazine unit 3 is pulled out of the stock unit 14, and the first magazine guide 6 is positionally adjusted with respect to the first magazine guide 5 to meet the length of new magazines 1 to be loaded. Then, the knob 39 is manually pulled to move the holder plate 37 in the direction of the arrow e out of engagement with a magazine 1 to be replaced. The rear end of the magazine 1 is pushed downwardly while preventing, by hand, the parts 2 from falling off the front end of the magazine 1, and the magazine 1 is pulled out backwards. Thereafter, the chute 23 and the guide 35 are replaced with those which meet the size of the new magazines.

With the arrangement of the present invention, when the magazines are removed from a magazine unit, the magazine unit can be loaded with new magazines full of parts without shutdown of the parts feeder since the stock unit is structurally independent of the supply unit.

Although a certain preferred embodiment of the present invention has been shown and described in detail, it should be understood that various changes and modifications may be made therein without departing from the scope of the appended claims.

We claim:

1. A parts feeder comprising:
   a stock unit including a plurality of magazine units arranged side by side and each accommodating a stack of magnazines each storing an array of parts;
   a supply unit including a plurality of devices arranged side by side and each having means for supporting a magazine removed from one of said magazine units and means for holding the array of parts discharged from said magazine, said supply unit being movable independently of said stock unit in a direction transverse to said array of parts; and
   an escape unit movable independently of the stock and supply units and in the direction of movement of the supply unit relative to the stock unit for removing a magazine, one at a time, from said magazine units and transferring said magazine to the supporting means of said supply unit.

2. A parts feeder according to claim 1, wherein said supporting means comprises a holder slider for holding a front end of said magazine and a guide for holding a rear end of said magazine, said holder slider being lower than said guide, said holder slider and said guide being selectively operable to release said magazine to fall by gravity.

3. A parts feeder according to claim 2, wherein said supporting means further includes a pair gripper jaws for transversely gripping said front end of said magazine.

4. A parts feeder according to claim 2, wherein said guide has a groove for receiving said rear end of said magazine.

5. A parts feeder according to claim 1, wherein said stock unit is inclined about 35 degrees to a horizontal direction.

6. A parts feeder according to claim 1, further including a base on which said supply unit is movably supported, said stock unit being fixedly mounted on said base.

7. A parts feeder according to claim 6, wherein said stock unit is suspended from said base.

8. A parts feeder according to claim 7, wherein said stock unit has guide grooves for inserting therein said magazine units, respectively, longitudinally of said magazines.

9. A parts feeder according to claim 7, including a sensor for detecting whether the magazine units are properly inserted in said stock unit.

10. A parts feeder according to claim 7, wherein each of said magazine units has a receiver lever for selectively holding and releasing the bottom of a lowermost magazine in the magazine unit.

11. A parts feeder according to claim 10, wherein each of said magazine units has a presser lever for transversely holding and releasing a magazine on said lowermost magazine in said magazine unit.

12. A parts feeder according to claim 11, wherein said receiver and presser levers are provided in two pairs which are spaced a distance smaller than the length of the magazines accommodated in said magazine.

13. A parts feeder according to claim 11, wherein each of said magazine units has a magazine guide having a groove having a width larger than the width of the magazines in said magazine unit and movable in a longitudinal direction of the magazine unit.

14. A parts feeder according to claim 10, wherein each of said magazine units has a grip handle mounted on an outer surface thereof.

15. A parts feeder according to claim 1, wherein said escape unit is movable toward and away from the magazine units in said stock unit, further including a base on which said supply unit is movably supported, said stock unit being fixedly mounted on said base.

16. A parts feeder according to claim 15, wherein said escape unit is positioned below said stock unit and is movable independently of said stock unit and said supply unit.

17. A parts feeder according to claim 15, wherein said escape unit includes a bucket for storing empty magazines that are free of parts.

18. A parts feeder comprising:
a stock unit including a plurality of magazine units arranged side by side and each accomodating a stack of magazines each storing an array of parts;
a supply unit including a plurality of devices arranged side by side and each having means for supporting a magazine removed from one of said magazine units and means for holding the array of parts discharged from said magazine, said supply unit being movable in a first direction transverse to a second direction in which said devices are arranged side by side; and
an escape unit for removing a magazine, one at a time, from said magazine units and transferring said magazine to the supporting means of said supply unit;
further including a base on which said supply unit is movably supported, said stock unit being fixedly mounted on said base;
wherein said stock unit is suspended from said base;
wherein each of said magazine units has flanges, said stock unit having means for loading and unloading said magazine units into and from the stock unit through one end thereof, said loading and unloading means including unit guides for supporting said flanges of said magazine units and guide grooves defined between said unit guides for positioning said magazine units respectively therein which are suspended by said unit guides.

* * * * *